US011366187B2

(12) United States Patent
Vernickel et al.

(10) Patent No.: US 11,366,187 B2
(45) Date of Patent: Jun. 21, 2022

(54) MULTI-CHANNEL RF TRANSMIT SYSTEM

(71) Applicant: KONINKLIJKE PHILIPS N.V., Eindhoven (NL)

(72) Inventors: Peter Vernickel, Hamburg (DE); Christoph Leussler, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 130 days.

(21) Appl. No.: 16/969,256

(22) PCT Filed: Feb. 12, 2019

(86) PCT No.: PCT/EP2019/053366
§ 371 (c)(1),
(2) Date: Aug. 12, 2020

(87) PCT Pub. No.: WO2019/158495
PCT Pub. Date: Aug. 22, 2019

(65) Prior Publication Data
US 2021/0003646 A1 Jan. 7, 2021

(30) Foreign Application Priority Data
Feb. 15, 2018 (EP) ..................................... 18156895

(51) Int. Cl.
*G01R 33/36* (2006.01)
*G01R 33/54* (2006.01)
(Continued)

(52) U.S. Cl.
CPC ....... *G01R 33/3614* (2013.01); *G01R 33/543* (2013.01); *H03F 1/0211* (2013.01); *H03F 3/21* (2013.01); *H03F 2200/451* (2013.01)

(58) Field of Classification Search
CPC . G01R 33/3614; G01R 33/543; H03F 1/0211; H03F 3/21; H03F 2200/451
See application file for complete search history.

(56) References Cited

U.S. PATENT DOCUMENTS 5,270,657 A 12/1993 Wirth et al.
10,371,772 B2 * 8/2019 Kawajiri ............ G01R 33/3875
(Continued)

FOREIGN PATENT DOCUMENTS

WO 2017032696 A1 3/2017

OTHER PUBLICATIONS

International Search Report and Written Opinion From PCT/EP2019/053366 dated Mar. 28, 2019.

*Primary Examiner* — G. M. A Hyder

(57) ABSTRACT

A multi-channel RF transmit system (1) especially for use in a magnetic resonance examination system comprising, a plurality of RF channels (18, 19) wherein each of the RF channels (18, 19) has an RF amplifier. The multi-channel RF transmit system (1) further comprises a power supply device (2) configured to supply power to the amplifiers (4, 5), a first capacitor bank (6), wherein the first capacitor bank (6) is connected to the power supply device (2) and connected to a first RF amplifier (4), a second capacitor bank (7), wherein the second capacitor bank (7) is connected to the power supply device (2) and connected to a second RF amplifier (5) and a third capacitor bank (8) also connected to the power supply device (2). The third capacitor bank (8) is connected to a DC switch (9), wherein the DC switch (9) is configured to switch the power supplied by the third capacitor bank (8) to the first amplifier (4) or the second amplifier (5). Therefore, a multi-channel RF transmit system (1) is disclosed where parts of the total available capabilities of discrete stored energy can be directed to one or the other RF amplifier channel (18, 19) leading to a more effective and cost saving design of the DC power supply chain.

13 Claims, 2 Drawing Sheets

(51) Int. Cl.
*H03F 1/02* (2006.01)
*H03F 3/21* (2006.01)

(56) References Cited

U.S. PATENT DOCUMENTS

| | | |
|---|---|---|
| 2007/0210863 A1* | 9/2007 | Schnell .............. G01R 33/3614 330/51 |
| 2008/0143438 A1 | 6/2008 | Albrecht et al. |
| 2009/0108681 A1 | 4/2009 | Litovsky |
| 2014/0009151 A1 | 1/2014 | Van Helvoort |
| 2017/0045595 A1 | 2/2017 | Machii et al. |
| 2017/0176555 A1 | 6/2017 | Kawajiri et al. |
| 2017/0261573 A1 | 9/2017 | Nakamura et al. |
| 2017/0285119 A1 | 10/2017 | Kanakasabai et al. |
| 2017/0346446 A1 | 11/2017 | May et al. |
| 2021/0116522 A1* | 4/2021 | Vernickel .................. H03F 3/24 |

* cited by examiner

MULTI-CHANNEL RF TRANSMIT SYSTEM

CROSS REFERENCE TO RELATED APPLICATIONS

This application is a U.S. national phase application of International Application No. PCT/EP2019/053366 filed on Feb. 12, 2019, which claims the benefit of EP Application Serial No. 18156895.7 filed on Feb. 15, 2018 and is incorporated herein by reference.

FIELD OF THE INVENTION

The invention relates to the field of multi-channel RF transmit systems, and in particular to a multi-channel RF transmit system for a magnetic resonance examination system, a magnetic resonance examination system comprising such a multi-channel RF transmit system, a method of operating such a multi-channel RF transmit system and a computer program comprising a computer program code adapted to perform the method.

BACKGROUND OF THE INVENTION

As is generally known in prior art that magnetic resonance examination system requires a RF transmit chain of special type and performance. In particular the RF transmit chain has to deal with a pulse power capability in the order of 10 kW, within the order of 1 ms and with short term high duty cycle RF pulses of about 100 ms. For the RF chain MOSFETS are often used for MRI amplifiers, where their operational properties depend on the bias point $I_{dq}$ and the drain voltage $V_{ds}$. The MOSFETS are put together forming a typical MRI amplifier with 16 kW forward power. The DC drain voltage $V_{ds}$ is supplied from a power supply device capable of providing CW power in the order of some kW. Especially the short term high duty cycle pulses for application in imaging is challenging for an optimized RF chain because the power supply has to realize the high energy demands in a short time frame.

Prior art approaches for overcoming these drawbacks make use of capacitor banks for storing electrical energy and make it available on short term. The capacitor bank gets recharged during and after the end of the RF pulse before the next pulse starts. Typically, its capacitance is in the order of 100 mF, which is typically realized by grouping a number of electrolyte capacitors.

US 2017/0176555 A1 discloses a magnetic resonance imaging apparatus wherein capacitor banks are connected to the power supply device and the corresponding amplification amplifiers. The capacitor banks temporarily store the incoming power from the power supply device, and discharge the stored power, when necessary, to the amplification amplifiers. Specifically, when it becomes necessary to pass large currents in a short time through the gradient coils of all axes, there may be a case in which the necessary power supply amount temporarily exceeds the power that can be supplied by the power supply device. Even in such a case, by virtue of the presence of the capacitor banks, power can be stably supplied to the gradient coils.

SUMMARY OF THE INVENTION

In known multi-channel RF transmit systems as the one described above, the RF demand from individual RF channels is often not equal in RF power and phase. Setting conditions for relative phase and relative power of employed RF power amplifiers for achieving a desired RF shimming for optimized homogeneity of an RF magnetic excitation field need to be applied in which one RF power amplifier has to deliver significantly more power than others, even up to its maximum power rating. In such cases, the maximum power rating may be reached quite soon, while the available power of other amplifiers remains unused. In principle one could design the DC supply chain of each individual RF amplifier in a way that each chain can provide enough DC power to reach the practical limits defined by patient safety limits. This approach leads to a DC supply chain in which the DC power available is over-specified resulting in a cost-ineffective design. Another option would be a shared DC supply chain where the different RFA share the same supply, which could then be more cost-efficient. But then the single amplifier performance might get dependent on the performance of the other RFA, when e.g. a strongly driven RFA causes a voltage drop of the DC voltage, originally intended to be stable.]

It is an object of the invention to realize an RF transmit system where parts of the total available capabilities of discrete stored energy can be directed to one or the other RF amplifier channel leading to a more effective, cost saving and decoupled design of the DC power supply chain. Furthermore, it is an object of the invention to distribute the DC power more equally over the RF channels.

According to the invention, this object is addressed by the subject matter of the independent claims. Preferred embodiments of the invention are described in the sub claims.

In one aspect of the present invention, the object is achieved by a multi-channel RF transmit system for a magnetic resonance examination system, the multi-channel RF transmit system comprises:

A multi-channel RF transmit system for a magnetic resonance examination system, comprising a plurality of RF channels wherein each of the RF channels has an RF amplifier configured to amplify an input signal and configured to output the amplified input signal as output signal, a power supply device configured to supply power to the amplifiers, at least a first capacitor bank, wherein the first capacitor bank is connected to a conductor path between the power supply device and a first RF amplifier, wherein the first capacitor bank is configured to supply power together with the power supply device to the first amplifier, a second capacitor bank, wherein the second capacitor bank is connected to a conductor path between the power supply device and a second RF amplifier, wherein the second capacitor bank is configured to supply power together with the power supply device to the second amplifier, at least a third capacitor bank, wherein the third capacitor bank is connected to a conductor path between the power supply device and a DC switch, wherein the third capacitor bank is configured to supply additional power, wherein the DC switch is configured to switch the power supplied by the third capacitor bank to the first amplifier or the second amplifier, and a controller configured to control the amplifiers and the DC switch depending on sensor data.

One advantage of the proposed multi-channel RF transmit system is that unequal RF power requirements for individual RF channels can be overcome by directing parts of the total available capabilities of discrete stored energy to one or the other RF amplifier depending on the actual RF demand. The redistribution of power from the capacitor banks allows the available DC power to be distributed more efficiently, or reasonably over the RF channels. The size (the capacitance) ratio of the capacitor banks depends on MR system (field strength) and coil type. A convenient ratio can easily determined using system usage statistics in the field.

In a preferred embodiment the power supply device is segmented in a plurality of segments, wherein each segment is capable of providing power. Segmenting of the DC supply chain gives a flexible and cost saving way to share the capabilitys of the power supply device among the amplifier modules.

In a preferred embodiment two or more capacitor banks are connected to the power supply device wherein each capacitor bank is connected to a DC switch configured to supply additional power.

In another preferred embodiment the DC switch is a solid state switch. The solid state switch is easy to realize as it can be realized such that switching is done only while the current is zero, wherein the gate-biasing is set such as to disable the transistor. Another advantage is that a solid state switch is fast and the switching of power can be done between different MR sequences or even during a MR sequence.

In a preferred embodiment the DC switch is a switching matrix. A switch matrix is advantageous for switching power between multiple capacitor banks and multiple amplifiers.

In another preferred embodiment the power supply device is segmented in a plurality of segments wherein each segment is capable of providing power. The segmentation of the power supply device is advantageous because it's flexible and certain segments of the power supply device can provide different voltages to the amplifiers and the capacitor banks.

In a preferred embodiment the at least one capacitor bank is connected to a segment of the power supply device.

In another preferred embodiment the segments are independent of each other.

In a preferred embodiment the controller gets input signals from sensors supervising the status of the capacitor banks.

In another preferred embodiment the controller is connected to a self-learning database.

In another aspect of the invention, the object is achieved by a magnetic resonance examination system comprising a multi-channel RF transmit system disclosed above.

In another aspect of the invention, the object is achieved by a method of operating an embodiment of the RF transmit system disclosed herein in the magnetic resonance examination system disclosed above. The method includes steps of:

providing the multi-channel RF transmit system with a plurality of RF channels wherein each of the RF channels has an RF amplifier configured to amplify an input signal and configured to output the amplified input signal as output signal, providing a power supply device configured to supply power to the amplifiers, providing at least a first capacitor bank, wherein the first capacitor bank is connected to a conductor path between the power supply device and a first RF amplifier (4), wherein the first capacitor bank is configured to supply power together with the power supply device to the first amplifier providing a second capacitor bank, wherein the second capacitor bank is connected to a conductor path between the power supply device and a second RF amplifier, wherein the second capacitor bank is configured to supply power together with the power supply device to the second amplifier, providing at least a third capacitor bank, wherein the third capacitor bank is connected to a conductor path between the power supply device and a DC switch, wherein the third capacitor bank is configured to supply additional power, wherein the DC switch is configured to switch the power supplied by the third capacitor bank to the first amplifier or the second amplifier, providing a controller configured to control the amplifiers and the DC switch depending on the RF demand, switching the power supplied by the third capacitor bank to the first amplifier or second amplifier based on sensor data.

In a preferred embodiment the method further comprising steps of:

starting a magnetic resonance examination, selecting the magnetic resonance method, the controller (3) getting sensor data from sensors supervising the status of the capacitor banks (6, 7, 8), comparing the sensor data with a database, selecting the switch (9) by the controller (3) based on the sensor data, starting magnetic resonance sequence, repeating the procedure after the magnetic resonance sequence is finished.

In another preferred embodiment the method further comprising steps of:

Switch is a solid state switch and the power is switched by the switch between different MR sequences.

In a preferred embodiment the method further comprising the steps of:

providing a switch wherein the switch is a solid state switch, switching the power during the MR sequence.

In another aspect of the invention, the object is achieved by a computer program comprising a computer program code adapted to perform a method or for use in a method according to claim 6 when said program is run on a programmable microcomputer.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
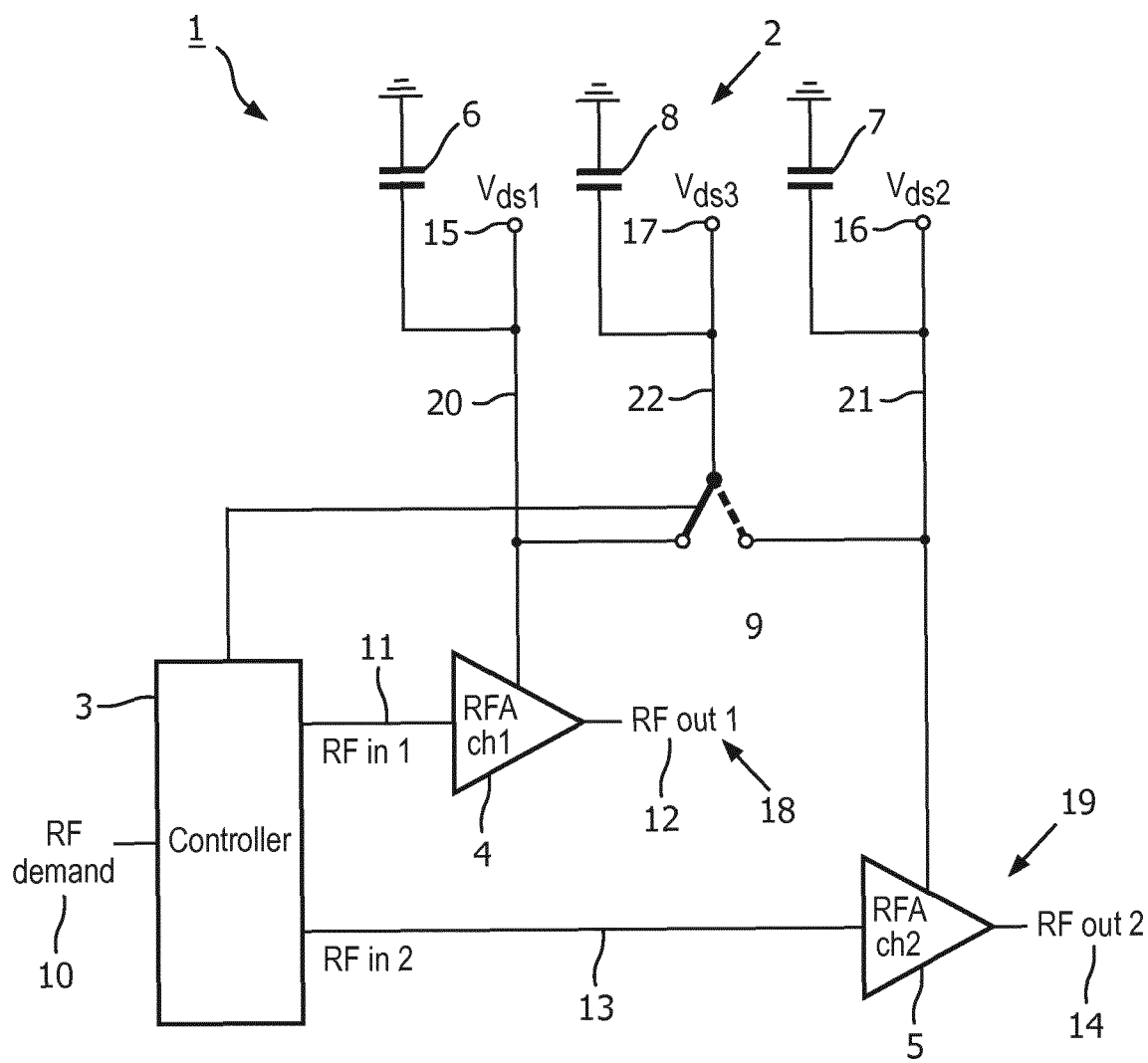
FIG. 1 shows a schematic illustration of a part of a magnetic resonance examination system including an embodiment of a RF transmit system in accordance with a preferred embodiment of the present invention.

FIG. 1 shows a schematic illustration of a part of an embodiment of a magnetic resonance examination system wherein a two-channel RF transmit system 1 is shown. The RF transmit system 1 comprises two RF channels 18, 19 wherein each channel 18, 19 has an amplifier 4, 5 connected to a controller 3. The amplifiers 4, 5 are connected to a power supply device 2 wherein the power supply device 2 is segmented into a plurality of segments 15, 16, 17. Each segment 15, 16, 17 is capable of providing power to the amplifiers 4, 5 independently. A first capacitor bank 6 is connected to a segment 15 of the power supply device 2 and is connected to a first amplifier 4. A second capacitor bank 7 is connected to a different segment 16 of the power supply device 2 and is connected to a second amplifier 5. The capacitor banks 6, 7, 8 temporarily store the incoming power from the power supply device 2 and discharge the stored power, when necessary, to the amplifiers 4, 5. The capacitor banks 6, 7 can be hard wired to one or the other amplifier channel 18, 19. A third capacitor bank 8 is connected to a different segment 17 of the power supply device. The third capacitor bank 8 is capable of providing an additional power together with the power supplied by the segment 17 of the power supply device 2. This additional power can be switched by a DC switch 9 to either the first RF channel 18 or to the second RF channel 19. The DC switch 9 can also be a solid state switch and/or a switch matrix. In a prefered embodiement having two RF amplifiers 4, 5 feeding the same coil mode, both RF amplifiers are connected to additional separate capacitor banks 8. Example is a 4 port drive of a quadrature body coil. Here each linear mode is fed by 2 RF amplifiers with 180 degree phase difference. A controller 3 operates the DC switch 9 depending on the actual RF demand 10. The controller 3 gets input signals from sensors supervising the status of the capacitor banks 6, 7, 8. The sensor signals are compared with a database. Additionally, the switching status depends on the coil loading, size and position of subject in the MR whole body transmit coil. Further depends on the MR method, Multi RF TX pulse (modulated in amplitude, time, phase, frequency) and RF shim status of the clinical protocol. The control module is digital and comprises a self-learning control module configured for self-learning based on the input parameters and a mathematical model. The redistribution of power from the capacitor bank 8 allows the available DC power to be distributed more equally over the RF channels 18, 19 leading to a more effective and cost saving design of the DC power supply chain.

Figure 2:
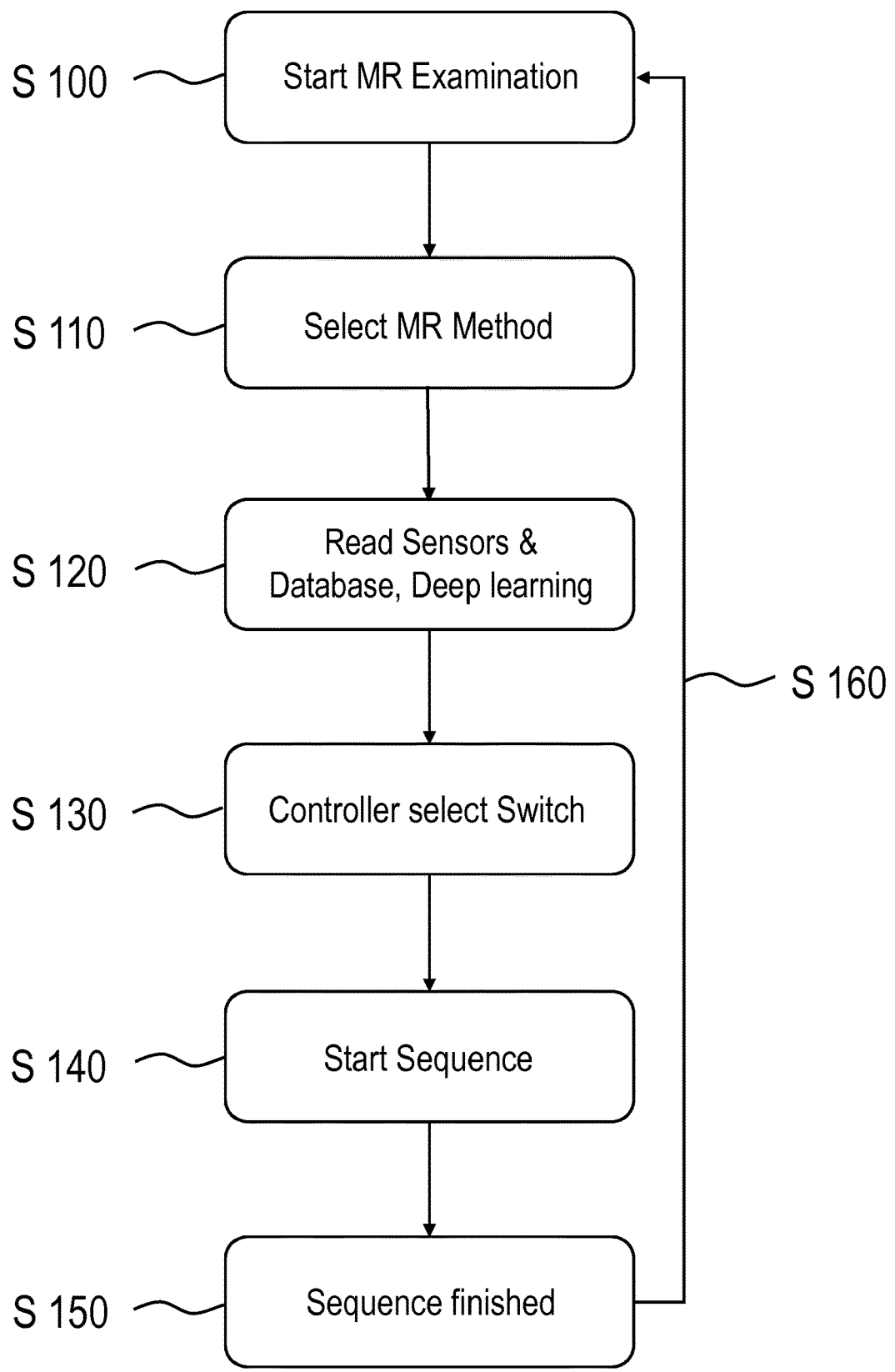
FIG. 2 shows a flow chart in accordance with a preferred embodiment of the present invention.

FIG. 2 shows a flow chart in accordance with a preferred embodiment of the present invention. The flow chart starts with step 100, according to which the MR Examination is started. In step 110 the MR Method is selected. In step 120 the controller gets sensor data from sensors supervising the status of the capacitor banks. The sensor signals are compared with a database. The control module is digital and comprises a self-learning control module configured for self-learning based on the input parameters and a mathematical model. In step 130 the controller selects the switch 9 based on information gathered by the sensors. In step 140 the magnetic resonance sequence is started. After the sequence is finished in step 150 the procedure is repeated in step 160.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

| REFERENCE SYMBOL LIST | |
|---|---|
| multi-channel RF transmit system | 1 |
| power supply device | 2 |
| controller | 3 |
| first RF amplifier | 4 |
| second RF amplifier | 5 |
| first capacitor bank | 6 |
| second capacitor bank | 7 |
| third capacitor bank | 8 |
| DC switch | 9 |
| RF demand signal | 10 |
| RF input channel | 11 |
| RF output channel | 12 |
| RF input channel | 13 |
| RF output channel | 14 |
| power supply segment | 15 |
| power supply segment | 16 |
| power supply segment | 17 |
| RF channel | 18 |
| RF channel | 19 |
| conductor path | 20 |
| conductor path | 21 |
| conductor path | 22 |

The invention claimed is:

1. A multi-channel RF transmit system for a magnetic resonance examination system, comprising
a plurality of RF channels wherein each of the RF channels has an RF amplifier configured to amplify an input signal and configured to output the amplified input signal as output signal,
a power supply device configured to supply power to the amplifiers
at least a first capacitor bank, wherein the first capacitor bank is connected to a conductor path between the power supply device and a first RF amplifier, wherein the first capacitor bank is configured to supply power together with the power supply device to the first amplifier,
at least a second capacitor bank, wherein the second capacitor bank is connected to a conductor path between the power supply device and a second RF amplifier, wherein the second capacitor bank is configured to supply power together with the power supply device to the second amplifier,
at least a third capacitor bank, wherein the third capacitor bank is connected to a conductor path between the power supply device and a DC switch, wherein the third capacitor bank is configured to supply additional power, wherein the DC switch is configured to switch the additional power supplied by the third capacitor bank to the first amplifier or the second amplifier, and
a controller configured to control the amplifiers depending on RF demand, the controller being configured to receive sensor data from sensors supervising the status of the capacitor banks the controller being configured to compare the sensor data with a database and the controller being configured to control the DC switch depending on the comparing of the sensor data with the database.

2. The multi-channel RF transmit system according to claim 1, wherein two or more capacitor banks are connected to the power supply device wherein each capacitor bank is connected to a DC switch configured to supply additional power.

3. The multi-channel RF transmit system according to claim 1, wherein the DC switch is a solid state switch.

4. The multi-channel RF transmit system according to claim 1, wherein the DC switch is a switching matrix.

5. The multi-channel RF transmit system according to claim 1, wherein the power supply device is segmented in a plurality of segments wherein each segment is capable of providing power.

6. The multi-channel RF transmit system according to claim 1, wherein at least one capacitor bank is connected to a segment of the power supply device.

7. The multi-channel RF transmit system according to claim 5, wherein the segments are independent of each other.

8. The multi-channel RF transmit system according to claim 1, wherein the controller is connected to a self-learning database.

9. A magnetic resonance examination system comprising a multi-channel RF transmit system according to claim 1.

10. A method for operating a multi-channel RF transmit system in a magnetic resonance examination system, the method comprising the steps of:
providing the multi-channel RF transmit system with a plurality of RF channels wherein each of the RF channels has an RF amplifier configured to amplify an input signal and configured to output the amplified input signal as output signal,
providing a power supply device configured to supply power to the amplifiers,
providing at least a first capacitor bank, wherein the first capacitor bank is connected to a conductor path between the power supply device and a first RF amplifier, wherein the first capacitor bank is configured to supply power together with the power supply device to the first amplifier,
providing at least a second capacitor bank, wherein the second capacitor bank is connected to a conductor path between the power supply device and a second RF amplifier, wherein the second capacitor bank is configured to supply power together with the power supply device to the second amplifier,
providing at least a third capacitor bank, wherein the third capacitor bank is connected to a conductor path between the power supply device and a DC switch,
wherein the third capacitor bank is configured to supply additional power,
wherein the DC switch is configured to switch the power supplied by the third capacitor bank (8) to the first amplifier or the second amplifier,
providing a controller configured to control the amplifiers and the DC switch depending on RF demand and configured to get sensor data from sensors supervising the status of the capacitor banks,
switching the power supplied by the third capacitor bank to the first amplifier or second amplifier based on comparing the sensor data with a database.

11. A method for operating a multi-channel RF transmit system as claimed in claim 10, further comprising steps of:
starting a magnetic resonance examination,
selecting a magnetic resonance method,
the controller getting sensor data from sensors supervising the status of the capacitor banks,
comparing the sensor data with a database,
selecting the switch by the controller based on the sensor data,
starting a magnetic resonance sequence,
repeating the procedure after the magnetic resonance sequence is finished.

12. A method for operating a multi-channel RF transmit system as claimed in claim 11, further comprising steps of:
providing the switch wherein the switch is a solid state switch,
switching the power during the magnetic resonance sequence.

13. A computer program comprising a computer program code adapted to perform a method according to claim 10 when said program is run on a programmable microcomputer.

* * * * *